United States Patent
Kitao et al.

(10) Patent No.: US 10,063,123 B2
(45) Date of Patent: Aug. 28, 2018

(54) ELECTRIC POWER CONVERTING APPARATUS

(71) Applicant: MITSUBISHI ELECTRIC CORPORATION, Chiyoda-ku (JP)

(72) Inventors: Junji Kitao, Chiyoda-ku (JP);
Yoshihiro Miyama, Chiyoda-ku (JP);
Akihiro Daikoku, Chiyoda-ku (JP);
Norihiro Watanabe, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 201 days.

(21) Appl. No.: 15/128,367

(22) PCT Filed: Apr. 22, 2015

(86) PCT No.: PCT/JP2015/062275
§ 371 (c)(1),
(2) Date: Sep. 22, 2016

(87) PCT Pub. No.: WO2015/182301
PCT Pub. Date: Dec. 3, 2015

(65) Prior Publication Data
US 2018/0177080 A1    Jun. 21, 2018

(30) Foreign Application Priority Data
May 28, 2014    (JP) .................... 2014-109759

(51) Int. Cl.
*H02K 9/19*    (2006.01)
*H05K 7/20*    (2006.01)
(Continued)

(52) U.S. Cl.
CPC ............. *H02K 9/19* (2013.01); *H05K 5/06* (2013.01); *H05K 7/20263* (2013.01);
(Continued)

(58) Field of Classification Search
CPC ........... H05K 7/20936; H05K 7/20927; H05K 7/20218–7/20272; H02K 9/22–9/28;
(Continued)

(56) References Cited

U.S. PATENT DOCUMENTS 5,729,063 A * 3/1998 Adachi ............... H02K 11/046
310/64
6,002,183 A * 12/1999 Iversen ............... H01L 23/467
257/691
(Continued)

FOREIGN PATENT DOCUMENTS

JP    9-191588 A    7/1997
JP    10-248198 A    9/1998
(Continued)

OTHER PUBLICATIONS

Office Action dated Sep. 5, 2017 in Japanese Patent Application No. 2016-523387 (with English language translation).
International Search Report dated Jul. 21, 2015, in PCT/JP2015/062275 filed Apr. 22, 2015.

*Primary Examiner* — Zachary M Pape
(74) *Attorney, Agent, or Firm* — Oblon, McClelland, Maier & Neustadt, L.L.P.

(57) ABSTRACT

In the electric power converting apparatus, a frame unit is configured by mounting an inner frame into an outer frame, brackets are disposed on two axial ends of the frame unit, an annular liquid cooling jacket is configured between the inner frame and the outer frame, the inner frame is configured into a tubular shape by bending a plurality of base members that are linked consecutively at thin linking portions between the base members, and butting together the base members that are positioned at two ends in a direction of linking, the power modules are mounted to respective side wall surfaces of the inner frame that face radially inward, and sealing members that seal the liquid cooling jacket are respectively
(Continued)

disposed in the butted portion of the base members, and between the frame unit and the bracket.

9 Claims, 17 Drawing Sheets

(51) Int. Cl.
*H01L 23/473* (2006.01)
*H05K 5/06* (2006.01)
*H01H 9/52* (2006.01)

(52) U.S. Cl.
CPC ..... *H05K 7/20409* (2013.01); *H05K 7/20927* (2013.01); *H01H 9/52* (2013.01); *H01L 23/473* (2013.01)

(58) Field of Classification Search
CPC .................................. H02K 9/19; H01H 9/52; H01L 23/40–23/473
USPC ............... 361/699, 715–716; 165/80.4–80.5, 165/104.33; 257/712–722; 310/64
See application file for complete search history.

(56) References Cited

U.S. PATENT DOCUMENTS

| | | | |
|---|---|---|---|
| 9,425,673 B2* | 8/2016 | Miyama | H02K 5/24 |
| 2007/0257568 A1* | 11/2007 | Akita | H02K 11/048 |
| | | | 310/64 |
| 2011/0018374 A1* | 1/2011 | Yamasaki | H01L 23/36 |
| | | | 310/64 |
| 2016/0276895 A1* | 9/2016 | Aizawa | H02K 3/522 |

FOREIGN PATENT DOCUMENTS

| | | |
|---|---|---|
| JP | 2004-364444 A | 12/2004 |
| JP | 2009-129974 A | 6/2009 |
| JP | 2010-124607 A | 6/2010 |
| JP | 2010-187504 A | 8/2010 |
| JP | 2010-288400 A | 12/2010 |
| JP | 2011-30405 A | 2/2011 |
| JP | 2011-176999 A | 9/2011 |
| JP | 2012-74440 A | 4/2012 |
| WO | WO 2013/118703 A1 | 8/2013 |

* cited by examiner

ELECTRIC POWER CONVERTING APPARATUS

TECHNICAL FIELD

The present invention relates to an electric power converting apparatus in which a power module and a controlling apparatus are housed inside a frame unit, and particularly relates to a liquid cooling construction for the power module.

BACKGROUND ART

In conventional driving apparatuses, a tubular heatsink, inside which a prismatic space is formed, is disposed on an axial end of a motor, and power modules are disposed on side wall surfaces that face radially inside the heatsink (see Patent Literature 1, for example).

In conventional rectifying apparatuses, diodes are mounted on a first surface of a flat heat sink parent material, and then a heatsink assembly is produced by bending and shaping the heat sink parent material into a circular arc shape (see Patent Literature 2, for example).

CITATION LIST

Patent Literature

Patent Literature 1: Japanese Patent Laid-Open No. 2011-176999 (Gazette)
Patent Literature 2: Japanese Patent Laid-Open No. 2010-288400 (Gazette)

SUMMARY OF THE INVENTION

Problem to be Solved by the Invention

In conventional driving apparatuses, because power modules are disposed on side wall surfaces that face radially inside the heatsink, reductions in apparatus size can be achieved. However, the operation of arranging the power modules on the side wall surfaces that face radially inside the heatsink is complicated, and one problem has been that assembly workability is reduced.

In conventional rectifying apparatuses, because diodes can be mounted to the flat first surface, the operation of arranging the diodes is simplified, improving assembly workability. However, the cooling construction for the diodes is an air-cooled construction, in which heat generated in the diodes is radiated from the radiating fins of the heatsink to air.

In compact high-output electric power converting apparatuses that are mounted to electric vehicles and hybrid vehicles, the power density of the electric power converting apparatus is high, increasing the amount of heat generated. Thus, if the heatsink assembly constructions in conventional rectifying apparatuses are applied to electric power converting apparatuses, then cooling of the power modules is insufficient using only air cooling, and temperature increases in the power modules cannot be suppressed, giving rise to a risk of damage to the power modules.

The present invention aims to solve the above problems and an object of the present invention is to provide an electric power converting apparatus that can achieve improvements in assembly workability and improvements in cooling performance of power modules.

Means for Solving the Problem

An electric power converting apparatus according to the present invention includes: a frame unit that is configured by mounting a tubular inner frame into a tubular outer frame in an internally fitted state; a bracket that is disposed on two axial ends or on one axial end of the frame unit; a liquid cooling jacket that is configured between the inner frame and the outer frame so as to have an annular shape; power modules that are housed inside the frame unit, and that convert direct-current power to alternating-current power; and a controlling apparatus that is housed inside the frame unit, and that controls driving of the power modules. The inner frame is configured into a tubular shape by bending a plurality of base members that are linked consecutively at linking portions between the base members, and butting together the base members that are positioned at two ends in a direction of linking, the power modules are mounted to respective side wall surfaces of the inner frame that face radially inward, and sealing members that seal the liquid cooling jacket are respectively disposed in the butted portion of the base members that are positioned at the two ends in the direction of linking, and between the frame unit and the bracket.

Effects of the Invention

According to the present invention, an inner frame is configured into an annular shape by bending at linking portions base members that are linked consecutively by the linking portions. Thus, power modules can be mounted to the base members in a state in which the consecutively linked base members are opened out rectilinearly, improving assembly workability for the power modules.

Because a liquid cooling jacket is configured between an outer frame and the inner frame, the power modules can be cooled using a liquid coolant, enabling cooling performance for the power modules to be improved.

DESCRIPTION OF EMBODIMENTS

Embodiment 1

Figure 1:
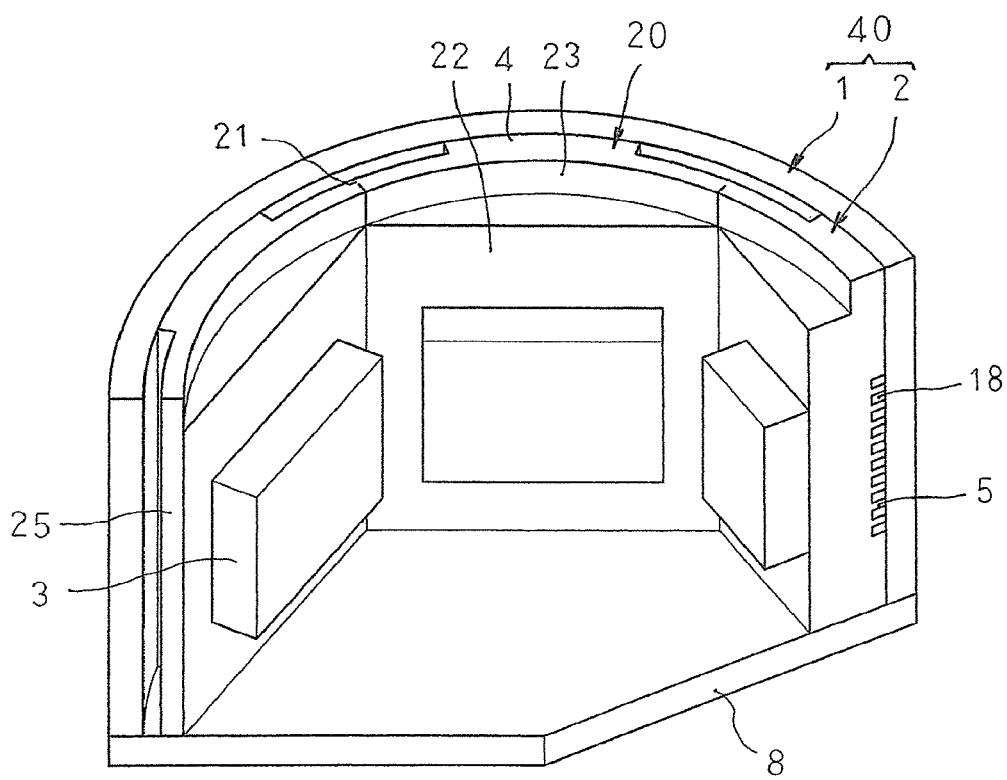
FIG. 1 is a partially cut away oblique projection that shows an electric power converting apparatus according to Embodiment 1 of the present invention.
Figure 2:
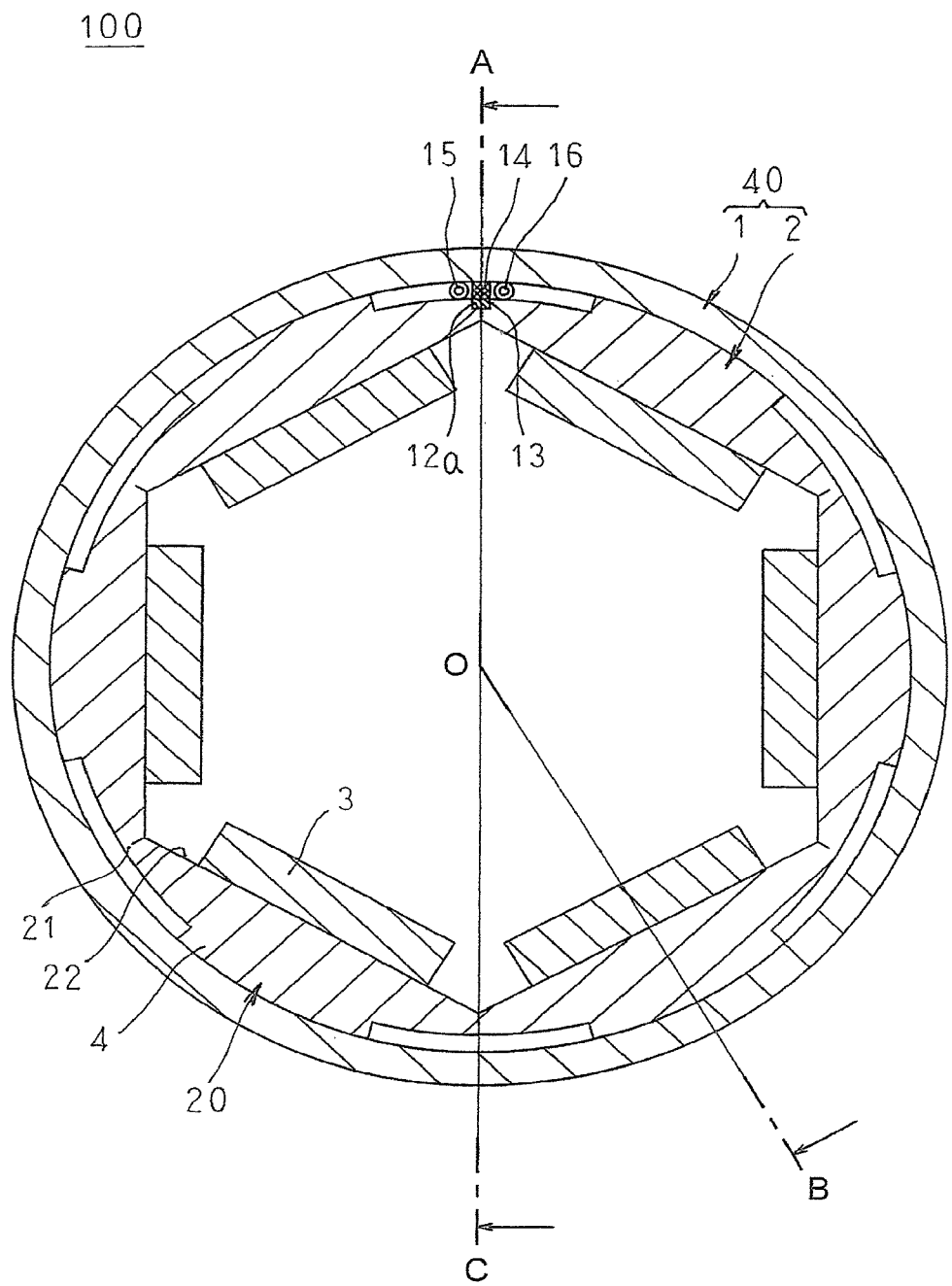
FIG. 2 is a lateral cross section that shows the electric power converting apparatus according to Embodiment 1 of the present invention.
Figure 3:
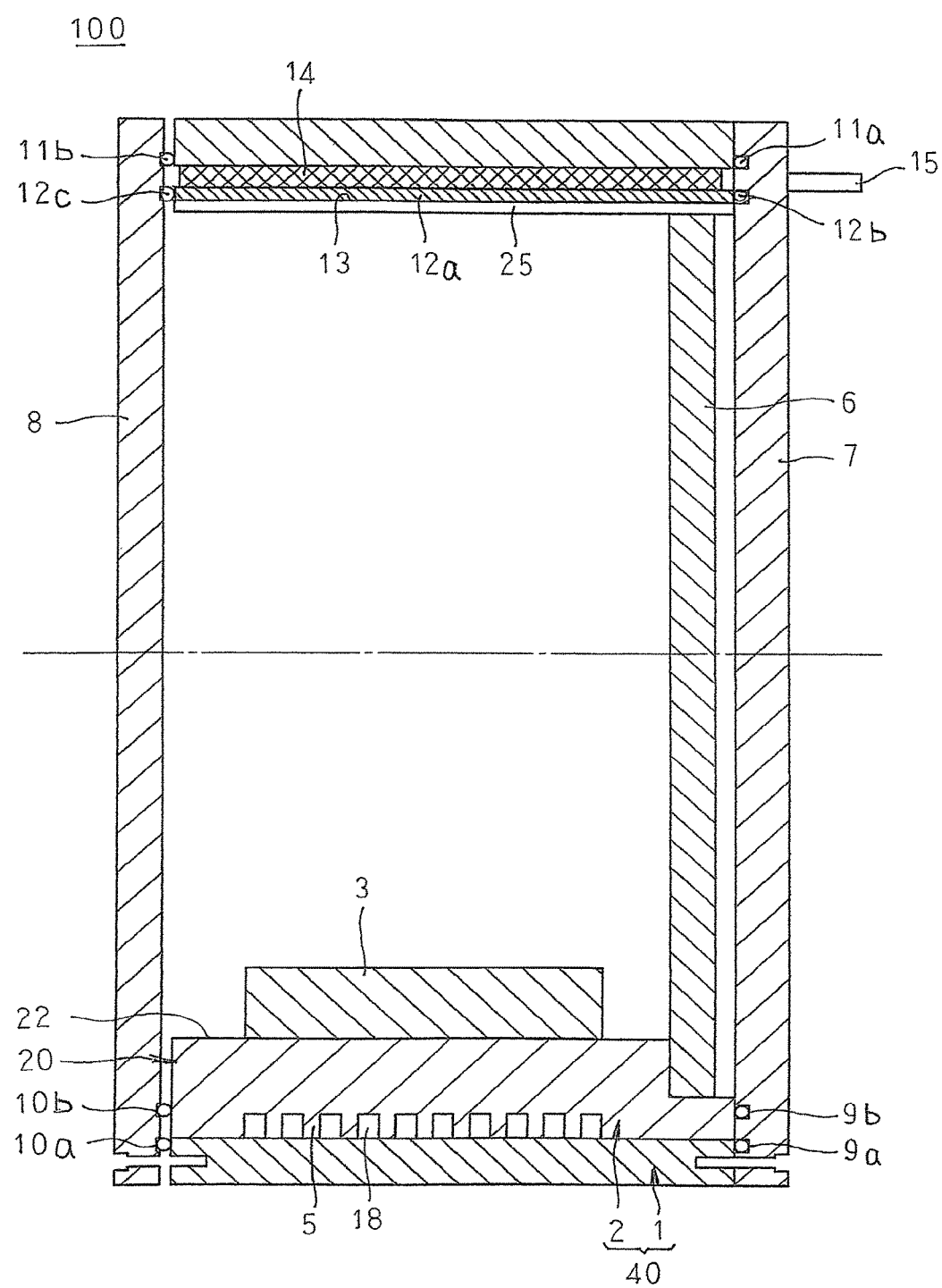
FIG. 3 is a cross section that is taken along A-O-B in FIG. 2 so as to be viewed in the direction of the arrows.
Figure 4:
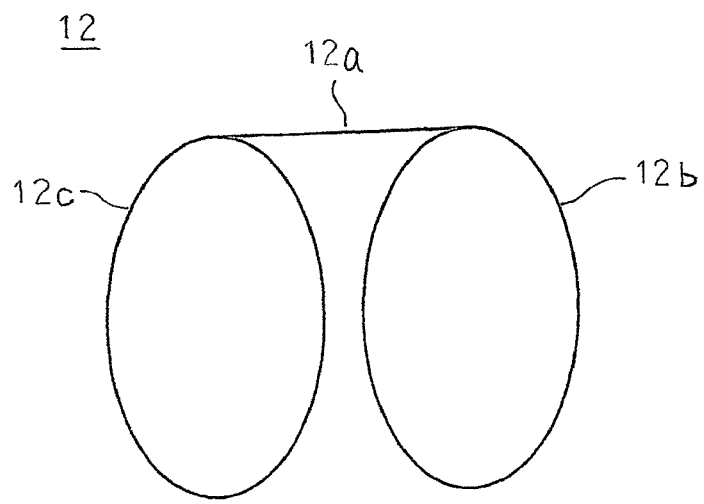
FIG. 4 is an oblique projection that shows an integrated sealing member in the electric power converting apparatus according to Embodiment 1 of the present invention.
Figure 5:
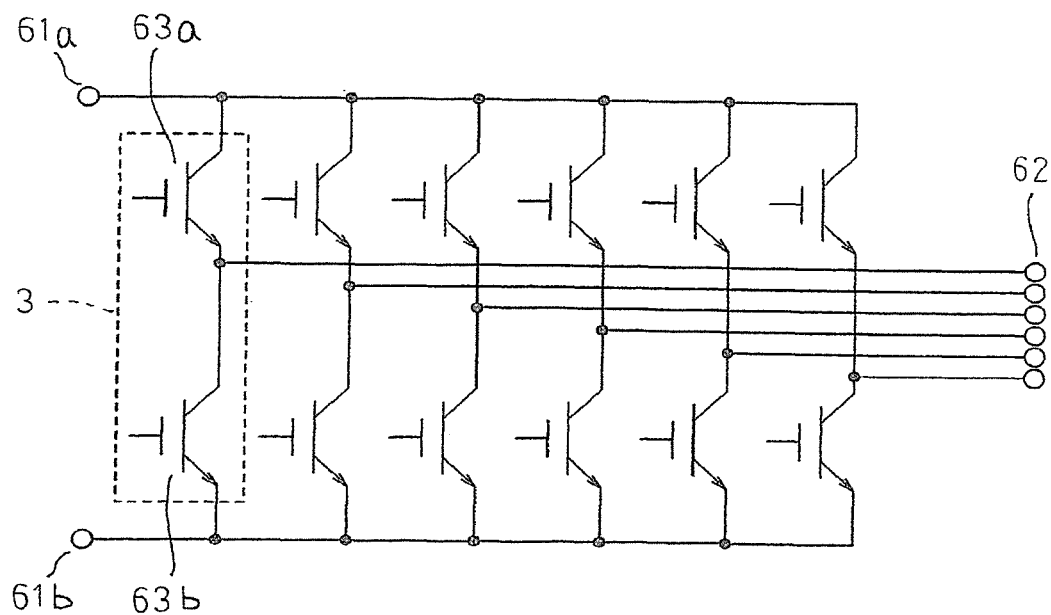
FIG. 5 is a circuit diagram for the electric power converting apparatus according to Embodiment 1 of the present invention.
Figure 6:
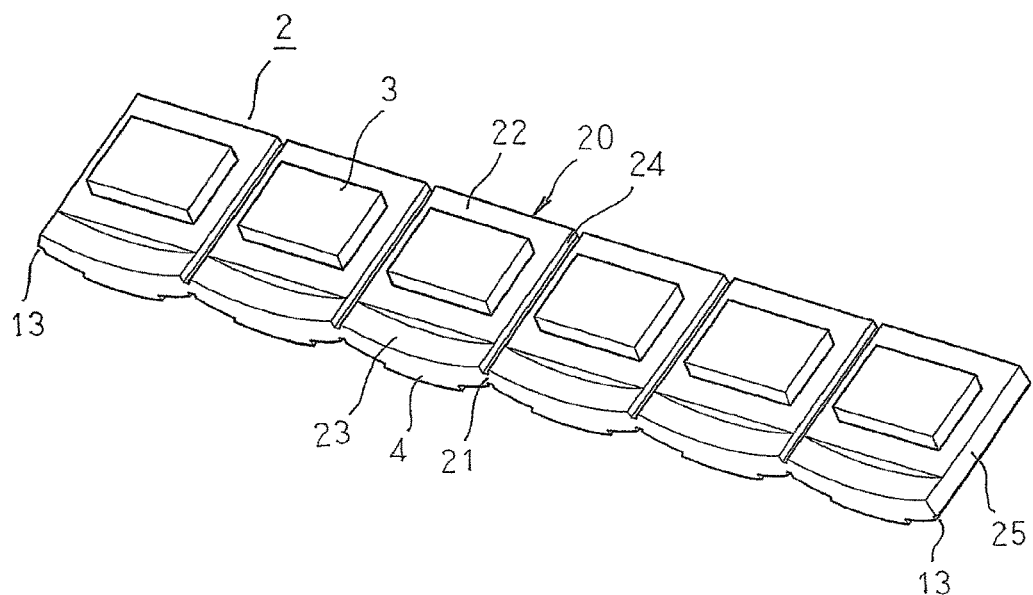
FIG. 6 is an oblique projection that shows a state in which an inner frame is opened out rectilinearly in the electric power converting apparatus according to Embodiment 1 of the present invention.
Figure 7:
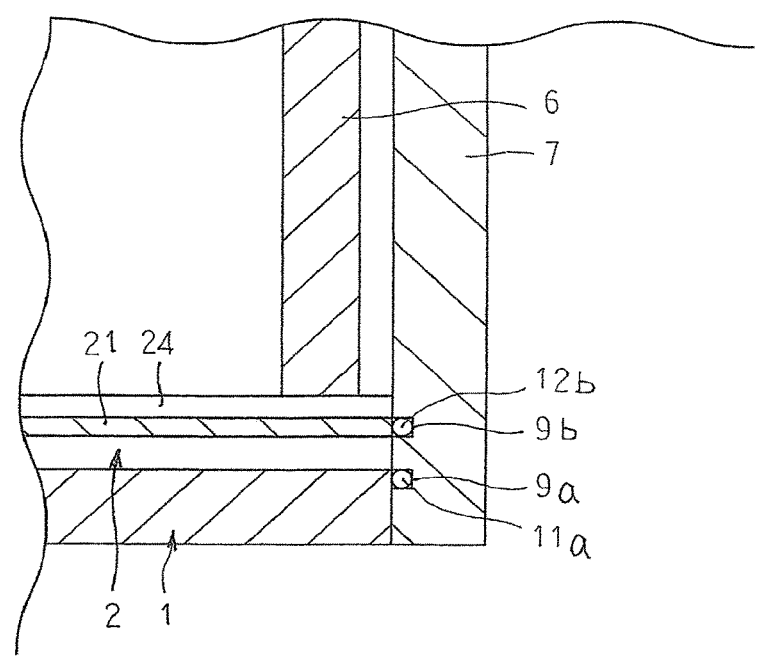
FIG. 7 is a partial cross section of a cross section that is taken along A-O-C in FIG. 2 so as to be viewed in the direction of the arrows.

FIG. 1 is a partially cut away oblique projection that shows an electric power converting apparatus according to Embodiment 1 of the present invention, FIG. 2 is a lateral cross section that shows the electric power converting apparatus according to Embodiment 1 of the present invention, FIG. 3 is a cross section that is taken along A-O-B in FIG. 2 so as to be viewed in the direction of the arrows, FIG. 4 is an oblique projection that shows an integrated sealing member in the electric power converting apparatus according to Embodiment 1 of the present invention, FIG. 5 is a circuit diagram for the electric power converting apparatus according to Embodiment 1 of the present invention, FIG. 6 is an oblique projection that shows a state in which an inner frame is opened out rectilinearly in the electric power converting apparatus according to Embodiment 1 of the present invention, and FIG. 7 is a partial cross section of a cross section that is taken along A-O-C in FIG. 2 so as to be viewed in the direction of the arrows. Moreover, for simplicity, a front bracket and a controlling circuit board are omitted in FIG. 1. Furthermore, a lateral cross section is a cross section in a plane that is perpendicular to an axial direction of the electric power converting apparatus.

In FIGS. 1 through 3, an electric power converting apparatus 100 includes: power modules 3; a controlling circuit board 6 that controls driving of the power modules 3; a frame unit 40 that houses the power modules 3, and the controlling circuit board 6, etc., internally; and a front bracket 7 and a rear bracket 8 that are disposed on two axial end portions of the frame unit 40, and that cover openings of the frame unit 40.

The frame unit 40 includes: an outer frame 1 that is produced so as to have a cylindrical shape; and an inner frame 2 that is housed and held in the outer frame 1 in an internally fitted state.

As described below, the inner frame 2 is formed by bending into an annular shape six base members 20 that are linked consecutively by thin linking portions 21 that function as linking portions, and is configured into a tubular body that has an inner circumferential surface that has a hexagonal prism shape internally. The power modules 3 are mounted to respective side wall surfaces (module-mounting surfaces) that face radially inside the inner frame 2. Protruding portions 4 are configured by making regions of the outer circumferential surface of the inner frame 2 that are radially outside the mounted regions of the respective power modules 3 protrude radially outward. The outer circumferential surfaces of the protruding portions 4 are constituted by portions of a cylindrical surface that has an outside diameter that is equal to that of an inside diameter of the inner circumferential surface of the outer frame 1. Grooves that extend in a circumferential direction are formed on the protruding portions 4 at a constant pitch in an axial direction to constitute radiating fins 5. A circumferential width of the radiating fins 5 matches a circumferential width of a region of contact between the inner frame 2 and the power modules 3.

A notch 13 is formed so as to extend from a first axial end to a second axial end on outer circumferential edge portions of the end portion butted surfaces 25 of the inner frame 2 that are positioned on Portion A-O in FIG. 2, and an I-shaped sealing member 12a is fitted into the notch 13. In addition, a partitioning plate 14 is disposed between the I-shaped sealing member 12a and the outer frame 1 such that a space that is formed between the protruding portions 4 that are formed on two sides of the notch 13 is partitioned into two spaces in a circumferential direction.

The controlling circuit board 6 is a controlling apparatus that controls driving of the power modules 3, and is disposed at a first axial end inside the frame unit 40 so as to be perpendicular to an axial direction. The front bracket 7 is produced so as to have a disk shape, is disposed at the first axial end of the frame unit 40, is fixed by fastening screws to the outer frame 1, and covers an opening at the first axial end of the frame unit 40. The rear bracket 8 is produced so as to have a disk shape, is disposed at the second axial end of the frame unit 40, is fixed by fastening screws to the outer frame 1, and covers an opening at the second axial end of the frame unit 40.

A front bracket first seal groove 9a is formed on a surface of the front bracket 7 that contacts the outer frame 1 so as to have an annular shape that has a groove direction in a circumferential direction. A front bracket second seal groove 9b is formed at a position on a surface of the front bracket 7 that contacts the inner frame 2 at a position that faces the thin linking portions 21 so as to have an annular shape that has a groove direction in a circumferential direction. A ring-shaped front-end first sealing member 11a is mounted into the front bracket first seal groove 9a, and a ring-shaped front-end second sealing member 12b is mounted into the front bracket second seal groove 9b.

A rear bracket first seal groove 10a is formed on a surface of the rear bracket 8 that contacts the outer frame 1 so as to have an annular shape that has a groove direction in a circumferential direction. A rear bracket second seal groove 9b is formed at a position on a surface of the rear bracket 8 that contacts the inner frame 2 at a position that faces the thin linking portions 21 so as to have an annular shape that has a groove direction in a circumferential direction. A ring-shaped rear-end first sealing member 11b is mounted into the rear bracket first seal groove 10a, and a ring-shaped rear-end second sealing member 12c is mounted into the rear bracket second seal groove 10b.

Here, as shown in FIG. 4, the I-shaped sealing member 12a, the front-end second sealing member 12b, and the rear-end second sealing member 12c are formed integrally as an integrated sealing member 12.

An inlet nipple 15 and an outlet nipple 16 are disposed on the front bracket 7 so as to face each of the two (first and second) spaces that are partitioned by the partitioning plate 14. A terminal unit (not shown) is also included on the front bracket 7.

In the electric power converting apparatus 100 that is configured in this manner, coolant flow channels 18 between the radiating fins 5 communicate with each other through the spaces that are configured between the protruding portions 4, such that an annular liquid cooling jacket is formed. Thus, in FIG. 2, a liquid coolant that is supplied from the inlet nipple 15 to the first space that is partitioned by the partitioning plate 14 circulates through the liquid cooling jacket counterclockwise in a circumferential direction, returns to the second space that is partitioned by the partitioning plate 14, and is discharged through the outlet nipple 16. Liquid coolant leakage from the liquid cooling jacket radially inward through the butted portion of the inner frame 2 at the end portions is prevented by the I-shaped sealing member 12a. Liquid coolant leakage from the liquid cooling jacket radially outward and inward between the frame unit 40 and the front bracket 7 is also prevented by the front-end first sealing member 11a and the front-end second sealing member 12b. In addition, liquid coolant leakage from the liquid cooling jacket racially outward and inward between the frame unit 40 and the rear bracket 6 is prevented by the rear-end first sealing member 11b and the rear-end second sealing member 12c.

Here, water, an antifreeze such as ethylene glycol, or an automatic transmission oil, etc., can be used as the liquid coolant.

Next, the electrical circuit in the electric power converting apparatus 100 will be explained with reference to FIG. 5.

The power modules 3 include an upper arm transistor 63a and a lower arm transistor 63b, the upper arm transistor 63a being inserted between a positive electrode terminal 61a and an alternating-current terminal 62, and the lower arm transistor 63b being inserted between the alternating-current terminal 62 and a negative electrode terminal 63b, to constitute a circuit for a single phase portion. The upper arm transistor 63a and the lower arm transistors 63b are resin-sealed using an insulating resin, and the positive electrode terminal 61a, the negative electrode terminal 61b, and the alternating-current terminal 62 extend outward from the resin-sealed portion.

The six power modules 3 that are configured in this manner are mounted internally into the electric power converting apparatus 100, a direct-current power supply (not shown) is connected to the positive electrode terminal 61a and the negative electrode terminal 61b, and input terminals of the alternating-current motor (not shown) are connected to the six alternating-current terminals 62. Moreover, although not shown, diodes are connected in parallel to the upper arm transistors 63a and the lower arm transistors 63b that constitute the power modules 3.

Semiconductor switching elements such as metal-oxide-semiconductor field-effect transistors (MOSFETs), or insulated gate bipolar transistors (IGBTs), for example, can be used for the upper arm transistors 63a and the lower arm transistors 63b.

Next, construction of the inner frame 2 will be explained with reference to FIG. 6.

The inner frame 2 is configured by linking the six base members 20 consecutively using the thin linking portions 21, the base members 20 being produced using a superior heat-conducting material such as aluminum, copper, etc.

The base members 20 are produced into a strap shape in which outer circumferential surfaces are constituted by portions of a cylindrical surface, and inner circumferential surfaces are constituted by flat surfaces that are perpendicular to a radial direction of the outer circumferential surface. In addition, portions on two circumferential sides of the outer circumferential surfaces of the base members 20 are constituted by portions of a cylindrical surface that is smaller in diameter than the outer circumferential surface at central portions of the outer circumferential surfaces of the base members 20. The circumferentially central portions of the base members 20 thereby protrude radially outward to form the protruding portions 4. Although not shown, the radiating fins 5 are also formed on the protruding portions 4. The inner circumferential surfaces of the base members 20 that are constituted by the flat surfaces form the module-mounting surfaces 22.

In addition, portions on a first longitudinal side of the inner circumferential surfaces of the base members 20 are constituted by portions of a cylindrical surface that is smaller in diameter than the cylindrical surface that constitutes the portions on the two circumferential sides of the outer circumferential surfaces of the base members 20.

Outer circumferential edge portions of the circumferential side surfaces of the six base members 20 that are configured in this manner are linked consecutively by the thin linking portions 21. Facing side surfaces on opposite sides of the thin linking portions 21 of the linked base members 20 constitute linking portion butted surfaces 24. A side surface in a first circumferential direction of the base member 20 that is positioned at a first end in a direction of linking constitutes an end portion butted surface 25, and a notch 13 is formed on an outer circumferential edge portion of the end portion butted surface 25. A side surface in a second circumferential direction of the base member 20 that is positioned at a second end in the direction of linking similarly constitutes an end portion butted surface 25, and a notch 13 is formed on an outer circumferential edge portion of the end portion butted surface 25. The six consecutively linked base members 20 are configured into an annular shape by bending the thin linking portions 21, then butting together the linking portion butted surfaces 24 of the base members 20, and finally butting together the end portion butted surfaces 25. The notches 13 and the thin linking portions 21 are positioned on a circumference of a common circle.

To assemble the electric power converting apparatus 100 that is configured in this manner, the inner frame 2 is first opened out rectilinearly, and the power modules 3 are mounted to the module-mounting surfaces 22 of the respective base members 20. Next, the I-shaped sealing member 12a is fitted into the notch 13 that is formed on the base member 20 that is positioned at the first end. Next, the six base members 20 are bent into an annular shape by bending the thin linking portions 21, to produce the annular inner frame 2.

Next, the inner frame 2 that is bent into an annular shape is inserted inside the outer frame 1 such that the recess portions 23 that are formed on the base members 20 are oriented toward a first axial end. In addition, the controlling circuit board 6 is disposed inside an annular recess portion that is formed by the recess portions 23 of the base members 20.

Next, the front-end first sealing member 11a and the front-end second sealing member 12b are mounted to the front bracket first seal groove 9a and the front bracket second seal groove 9b that are formed on the front bracket 7. Then, the front bracket 7 is fixed to the first axial end of the outer frame 1 and the inner frame 2 using screws.

Next, the rear-end first sealing member 11b and the rear-end second sealing member 12c are mounted to the rear bracket first seal groove 10a and the rear bracket second seal groove 10b that are formed on the rear bracket 8. Then, the rear bracket 8 is fixed to the second axial end of the outer frame 1 and the inner frame 2 using screws, to assemble the electric power converting apparatus 100.

In Patent Literature 1, for example, power modules are mounted to side wall surfaces that face radially inside a tubular heatsink (corresponding to the inner frame 2). Thus, because the fixing of the power modules to the module-mounting surfaces is a complicated operation inside the tubular heatsink, assembly workability is reduced. According to Embodiment 1, on the other hand, because the power modules 3 can be mounted to the module-mounting surfaces 22 in a state in which the inner frame 2 is opened out rectilinearly, fixing of the power modules 3 to the module-mounting surfaces 22 becomes a simple operation, improving assembly workability for the power modules 3.

The base members 20 are linked using only the thin linking portions 21. Thus, even if a power module 3 fails and shorts internally, making a large current flow, and generating an amount of heat that is greater than or equal to specifications, the heat in question is less likely to transfer to neighboring base members 20 through the thin linking portions 21, and will be radiated to the liquid coolant that flows between the radiating fins 5. Thus, even if one power module 3 hypothetically fails and generates heat, situations such as the heat in question transferring to other power modules 3 and damaging the other power modules 3 are prevented.

Because the inner frame 2 is formed into an annular shape by bending the base members 20 that are linked consecutively by the thin linking portions 21 at the thin linking portions 21, the butted portion at the end portion butted surfaces 25 becomes the only joint on the outer circumferential surface of the inner frame 2. Thus, because the liquid cooling jacket can be configured between the outer frame 1 and the inner frame 2 simply by disposing a sealing construction at three positions, i.e., the butted portion at the end portion butted surfaces 25, the connecting portion between the front bracket 7 and the first axial end surface of the frame unit 40, and the connecting portion between the rear bracket 8 and the second axial end surface of the frame unit 40, the electric power converting apparatus 100 can be reduced in size.

Because the power modules 3 are cooled using a liquid coolant, cooling performance for the power modules 3 is improved. In addition, because the radiating fins 5 are formed on the outer circumferential portion of the base members 20 so as to protrude into the liquid cooling jacket, heat that is generated by the power modules 3, which are mounted to the module-mounting surfaces 22 of the base members 20, can be radiated to the liquid coolant efficiently. A high-output electric power converting apparatus that can be mounted to electric vehicles and hybrid vehicles can be achieved thereby.

Because the base members 20 that are linked consecutively by the thin linking portions 21 are configured into an annular shape by bending the thin linking portions 21, and butting together circumferential side surfaces of the base members 20, the inner circumferential surface of the liquid cooling jacket that is formed between the protruding portions 4 of the base members 20 can be formed so as to have an approximately cylindrical surface. Consequently, pressure loss in the liquid coolant that flows through the liquid cooling jacket that is formed between the protruding portions 4 of the base members 20 can be reduced.

Moreover, in Embodiment 1 above, the outer circumferential edge portions of the circumferential side surfaces of the base members 20 are linked together by the thin linking portions 21, but inner circumferential edge portions of the circumferential side surfaces of the base members 20 may be linked together by the thin linking portions 21, or radially central portions of the circumferential side surfaces of the base members 20 may be linked together by the thin linking portions 21.

In Embodiment 1 above, because the base members 20 are linked by the thin linking portions 21, and are opened out rectilinearly, the circumferentially divided radiating fins 5 correspond in number to the number of base members 20. However, the number of radiating fins 5 may be made greater than the number of the power modules 3. Specifically, if the number of radiating fins 5 is made greater than the number of the power modules 3, cooling of the power modules 3 can be improved.

In Embodiment 1 above, the circumferential width of the radiating fins 5 matches the circumferential width of the regions of contact between the inner frame 2 and the power modules 3, but the circumferential width of the radiating fins 5 may be made wider than the circumferential width of the region of contact between the inner frame 2 and the power modules 3. Specifically, cooling of the power modules 3 can be improved if the circumferential width of the radiating fins 5 is set to a length that is greater than or equal to the circumferential width of the region of contact between the inner frame 2 and the power modules 3.

In Embodiment 1 above, the radiating fins 5 are each formed so as to extend in a circumferential direction on outer circumferential surfaces of the protruding portions 4 at a constant pitch in an axial direction, but radiating fins 5 may be each formed so as to extend in an axial direction on outer circumferential surfaces of the protruding portions 4 at a constant pitch in a circumferential direction.

Embodiment 2

Figure 8:
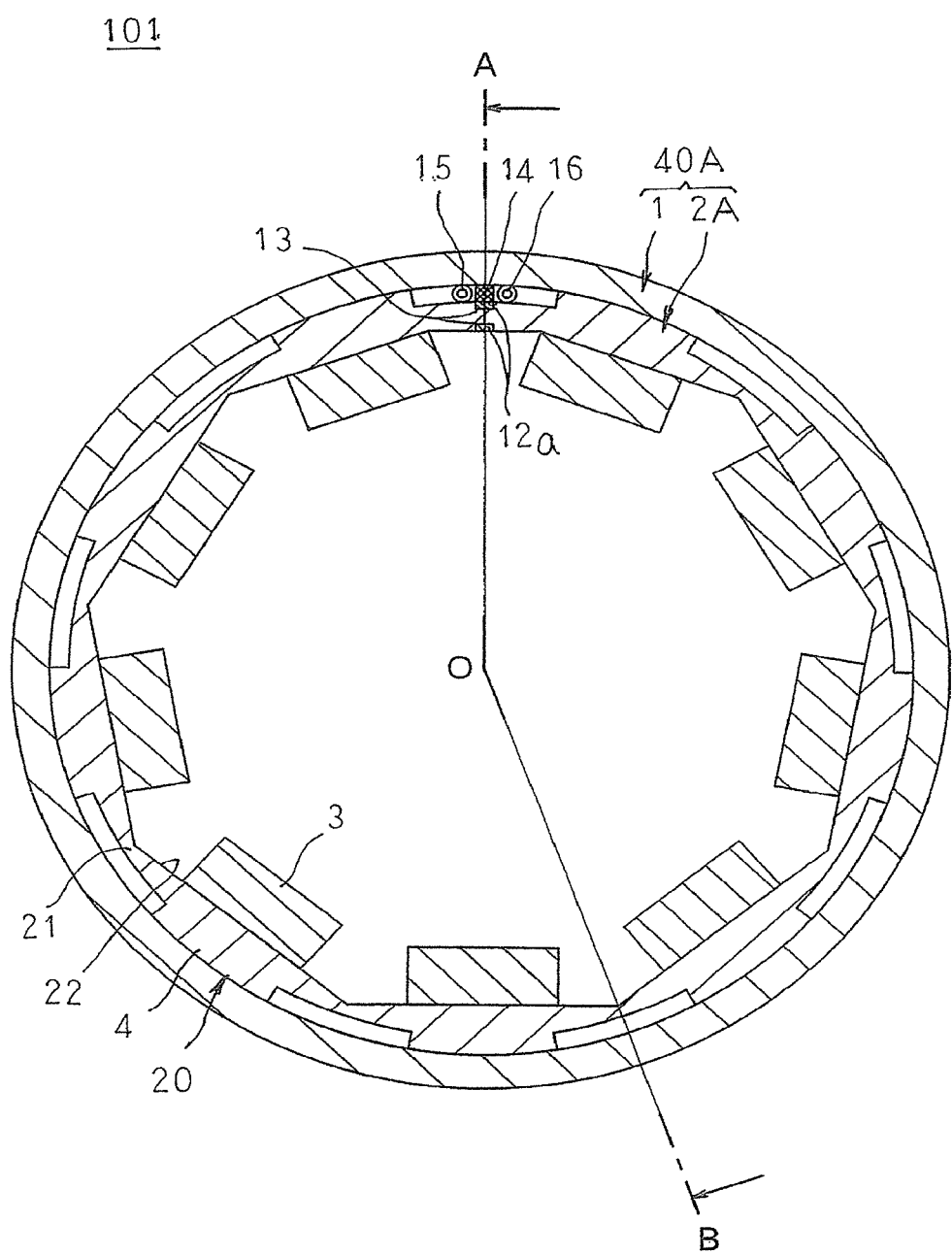
FIG. 8 is a lateral cross section that shows an electric power converting apparatus according to Embodiment 2 of the present invention.
Figure 9:
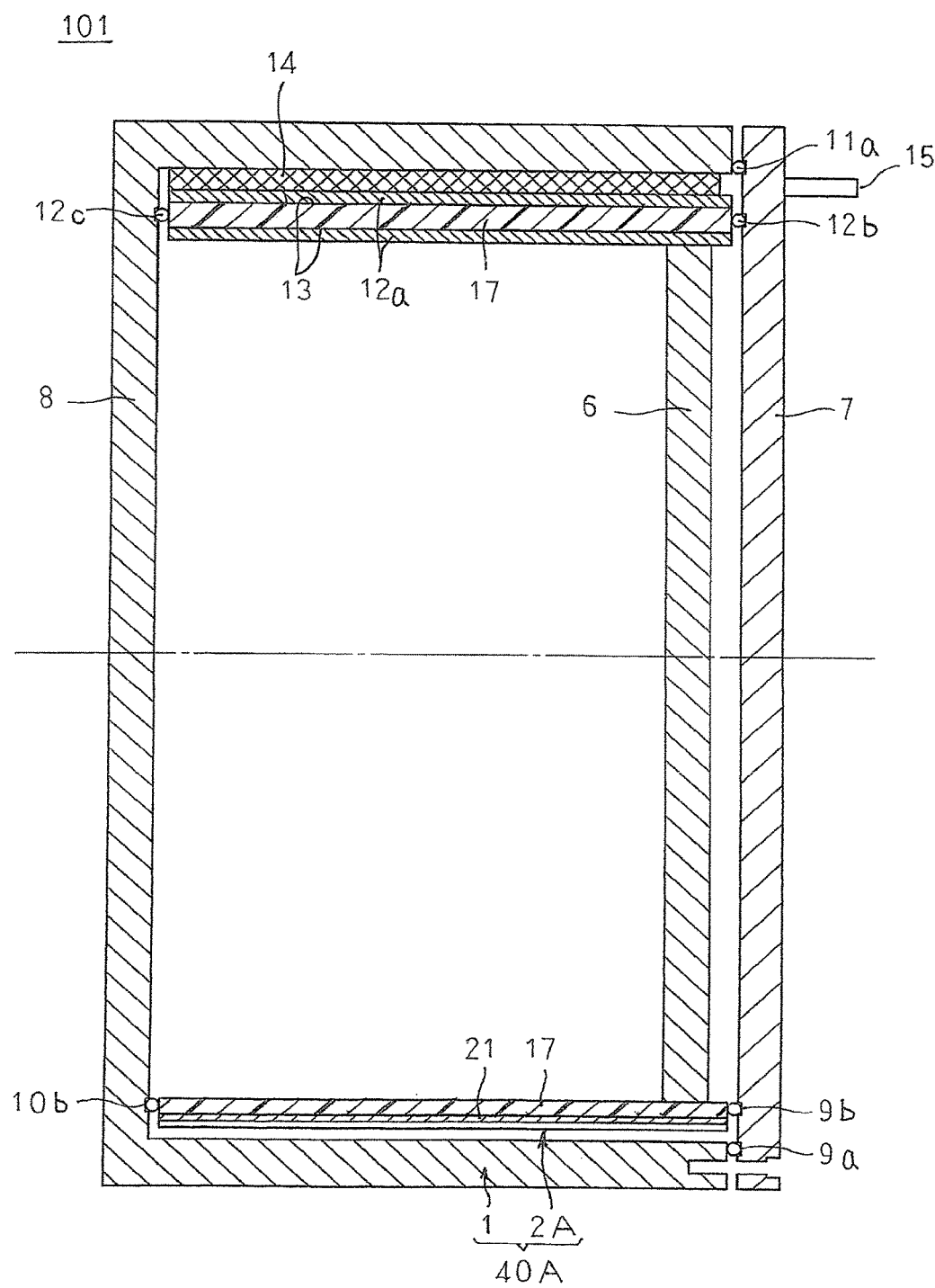
FIG. 9 is a cross section that is taken along A-O-B in FIG. 8 so as to be viewed in the direction of the arrows.
Figure 10:
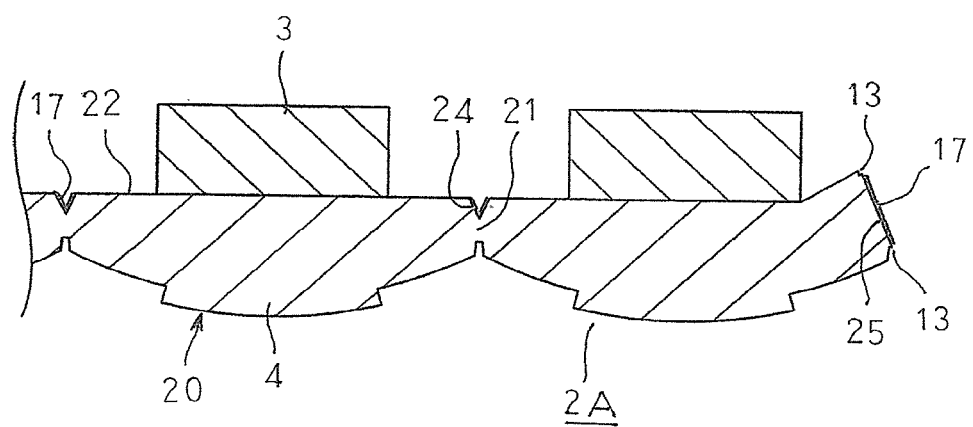
FIG. 10 is a partial cross section that shows a state in which an inner frame is opened out rectilinearly in the electric power converting apparatus according to Embodiment 2 of the present invention.

FIG. 8 is a lateral cross section that shows an electric power converting apparatus according to Embodiment 2 of the present invention, FIG. 9 is a cross section that is taken along A-O-B in FIG. 8 so as to be viewed in the direction of the arrows, and FIG. 10 is a partial cross section that shows a state in which an inner frame is opened out rectilinearly in the electric power converting apparatus according to Embodiment 2 of the present invention.

In FIGS. 8 through 10, an outer frame 1 and a rear bracket 8 are formed integrally, and are configured so as to have a floored cylindrical shape.

The inner frame 2A is configured into a tubular body that has inner circumferential surfaces that have a nonagonal prism shape internally by bending nine base members 20 into an annular shape using thin linking portions 21, radially central portions of the circumferential side surfaces of the base members 20 being linked together consecutively by the thin linking portions 21, and butting together end portion butted surfaces 25 of the base members 20 that are positioned at two ends in a direction of linking. Notches 13 are formed so as to extend from a first axial end to a second axial end on radially outer edge portions and radially inner edge portions of the end portion butted surfaces 25 of the base members 20 that are positioned at the two ends in the direction of linking. An I-shaped sealing member 12*a* is fitted into each of the notches 13.

A front bracket first seal groove 9*a* is formed on a surface of a front bracket 7 that contacts the outer frame 1 so as to have an annular shape that has a groove direction in a circumferential direction. A front bracket second seal groove 9*b* is formed at a position on a surface of the front bracket 7 that contacts the inner frame 2A radially inside the thin linking portions 21 so as to have an annular shape that has a groove direction in a circumferential direction. A front-end first sealing member 11*a* is mounted into the front bracket first seal groove 9*a*, and a front-end second sealing member 12*b* is mounted into the front bracket second seal groove 9*b*.

A rear bracket second seal groove 9*b* is formed at a position on a surface of the rear bracket 8 that contacts the inner frame 2 radially inside the thin linking portions 21 so as to have an annular shape that has a groove direction in a circumferential direction. A rear-end second sealing member 12*c* is mounted into the rear bracket second seal groove 10*b*.

To assemble the electric power converting apparatus 101 that is configured in this manner, the inner frame 2A is first opened out rectilinearly, and the power modules 3 are mounted to module-mounting surfaces 22 of the respective base members 20. Next, the I-shaped sealing members 12*a* are fitted into the notches 13 that are formed on the base member 20 that is positioned at the first end. Next, a liquid gasket 17 that functions as an auxiliary sealing material or a sealing member is applied to each of the linking portion butted surfaces 24 and the end portion butted surfaces 25, and the nine base members 20 are bent into an annular shape by bending the thin linking portions 21, to produce the annular inner frame 2A.

Next, the rear-end second sealing member 12*c* is mounted into the rear bracket second seal groove 10*b* that is formed on the rear bracket 8. Next, the inner frame 2A that is bent into an annular shape is inserted inside the outer frame 1. In addition, the controlling circuit board 6 is disposed at a first axial end inside the inner frame 2A.

Next, the front-end first sealing member 11*a* and the front-end second sealing member 12*b* are mounted to the front bracket first seal groove 9*a* and the front bracket second seal groove 9*b* that are formed on the front bracket 7. Then, the front bracket 7 is fixed to the first axial end of the outer frame 1 and the inner frame 2A using screws, to assemble the electric power converting apparatus 101.

Here, a frame unit 40A includes the outer frame 1 and the inner frame 2A. In the electric power converting apparatus 101, because nine power modules 3 are mounted, a positive electrode terminal 61*a*, a negative electrode terminal 61*b*, and nine alternating-current terminals 62 are included in a terminal unit (not shown) that is mounted to the front bracket 7.

Moreover, the rest of the configuration is formed in a similar or identical manner to that of Embodiment 1 above.

In the electric power converting apparatus 101 that is configured in this manner, a liquid cooling jacket is also formed in which a liquid coolant that is supplied from the inlet nipple 15 to the first space that is partitioned by the partitioning plate 14 circulates through the liquid cooling jacket counterclockwise in a circumferential direction, returns to the second space that is partitioned by the partitioning plate 14, and is discharged through the outlet nipple 16. Liquid coolant leakage from the liquid cooling jacket radially inward through the butted portion of the inner frame 2 at the end portions is prevented by the I-shaped sealing member 12*a*. Liquid coolant leakage from the liquid cooling jacket radially outward and inward between the frame unit 40A and the front bracket 7 is also prevented by the front-end first sealing member 11*a* and the front-end second sealing member 12*b*. In addition, liquid coolant leakage from the liquid cooling jacket radially outward and inward between the frame unit 40A and the rear bracket 6 is prevented by the rear-end first sealing member 11*b* and the rear-end second sealing member 12*c*.

In Embodiment 2, the inner frame 2A is configured by consecutively linking nine base members 20 using thin linking portions 21. The liquid cooling jacket is configured between the outer frame 1 and the inner frame 2 simply by disposing a sealing construction at three positions, i.e., the butted portion at the end portion butted surfaces 25, the connecting portion between the front bracket 7 and the first axial end surface of the frame unit 40A, and the connecting portion between the rear bracket 8 and the inner frame 2A. Consequently, similar or identical effects to those of Embodiment 1 above can also be achieved in Embodiment 2.

According to Embodiment 2, because the liquid gasket 17 is applied to the linking portion butted surfaces 24 and the end portion butted surfaces 25 of the base members 20, freedom of arrangement of the front-end and rear-end second sealing members 12*b* and 12*c* is increased. Because the liquid gasket 17 is disposed in the butted portion of the linking portion butted surfaces 24, radial regions from the thin linking portions 21 to the radially inner edges of the inner frame 2A become sealed regions at the positions of the thin linking portions 21 of the inner frame 2A. Because the liquid gasket 17 is disposed in the butted portion of the end portion butted surfaces 25, an entire radial region of the inner frame 2A also becomes a sealed region at the position of the butted portion of the end portion butted surfaces 25 of the inner frame 2A. Consequently, the front-end and rear-end second sealing members 12*b* and 12*c* can be disposed in a radial region in which the radial sealed regions at the position of the thin linking portions 21 and the radial sealed region at the position of the butted portion of the end portion butted surfaces 25 overlap. In other words, the front-end and rear-end second sealing members 12*b* and 12*c* may be disposed at radial positions that faces the thin linking portions 21, or may be disposed radially inside the thin linking portions 21.

Because the outer frame 1 and the rear bracket 8 are formed integrally, a rear-end first sealing member 11*b* is no longer required, enabling the number of parts to be reduced, and improving assembly workability.

Moreover, in Embodiment 2 above, the thin linking portions 21 are formed so as to link radially central portions of the side surfaces of the base members 20, but the thin linking portions 21 may be formed so as to link outer circumferential edge portions of the side surfaces of the base members 20.

Embodiment 3

Figure 11:
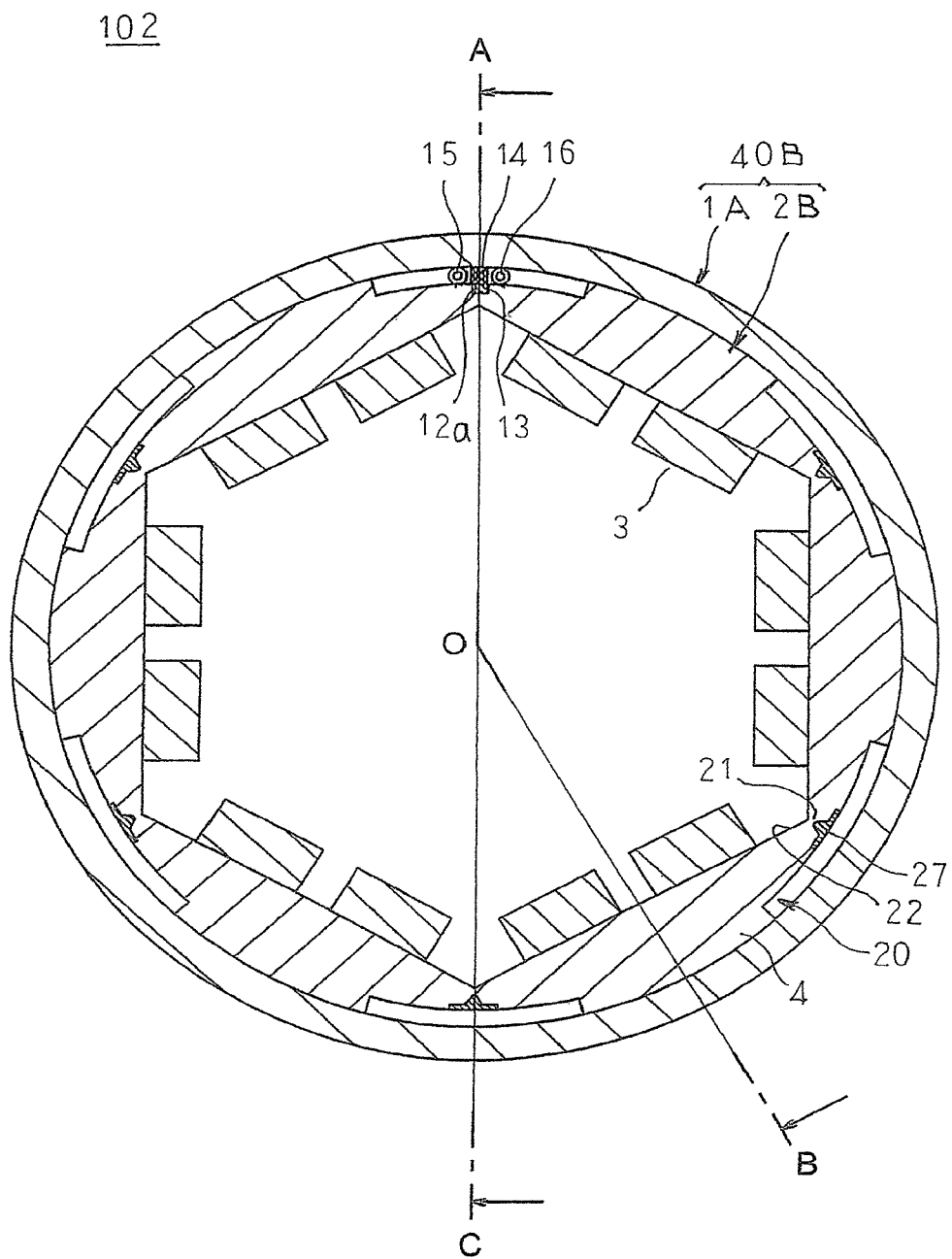
FIG. 11 is a lateral cross section that shows an electric power converting apparatus according to Embodiment 3 of the present invention.
Figure 12:
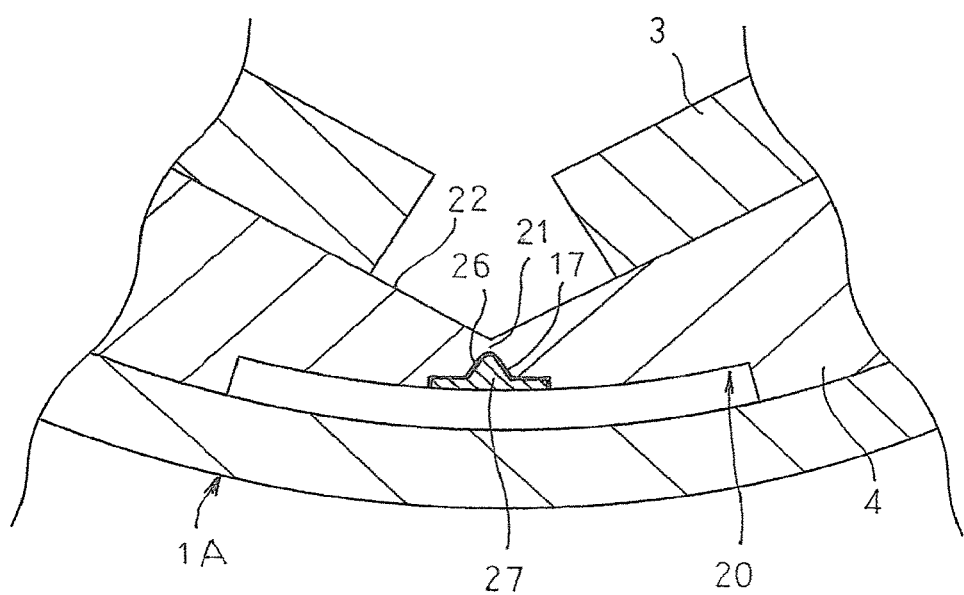
FIG. 12 is a partial cross section that shows a vicinity of an embedded member from FIG. 11.
Figure 13:
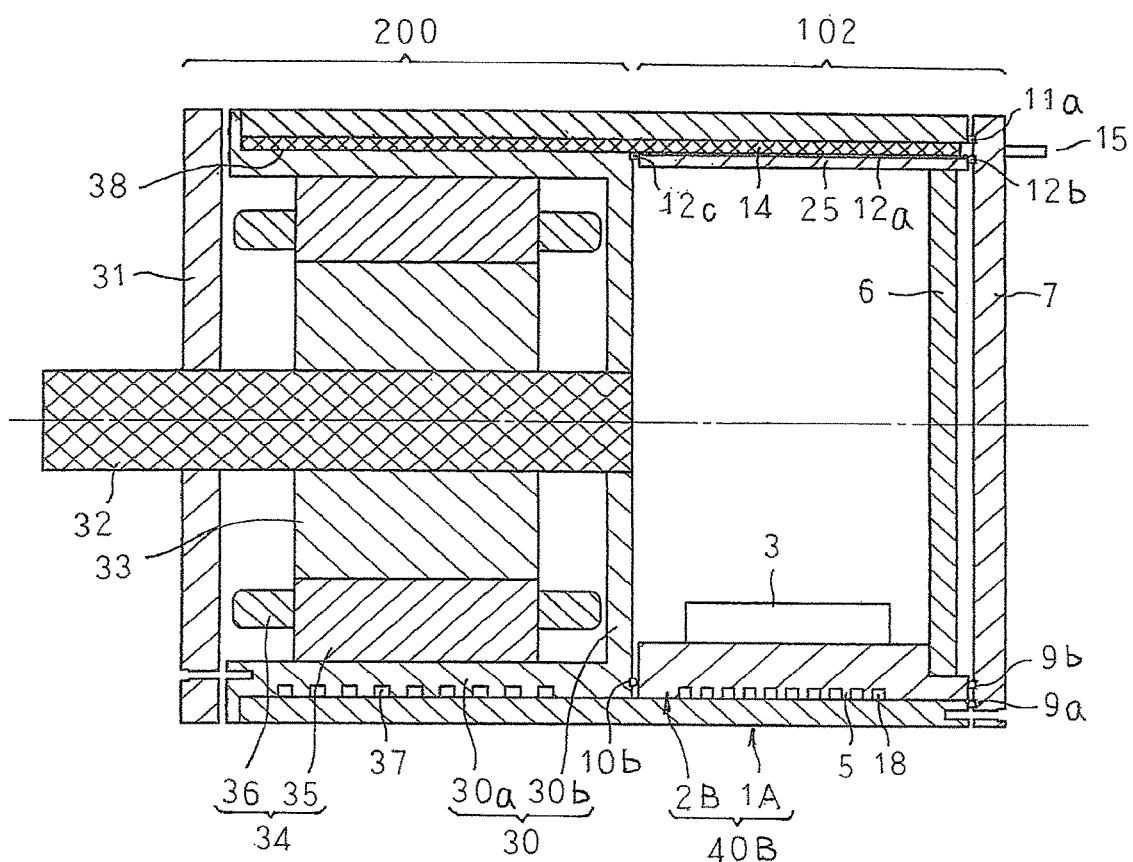
FIG. 13 is a cross section that is taken along A-O-B in FIG. 11 so as to be viewed in the direction of the arrows.
Figure 14:
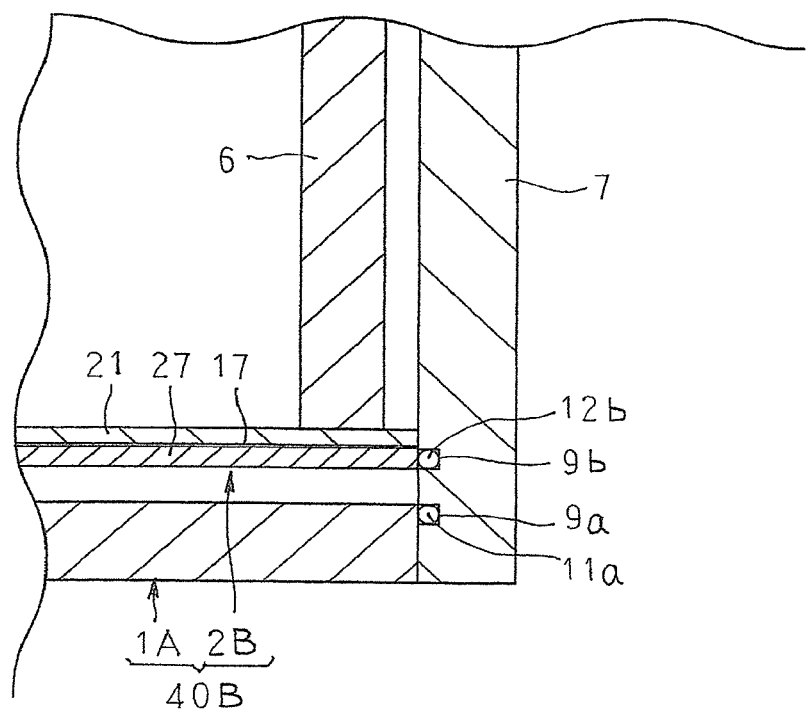
FIG. 14 is a partial cross section of a cross section that is taken along A-O-C in FIG. 11 so as to be viewed in the direction of the arrows.
Figure 15:
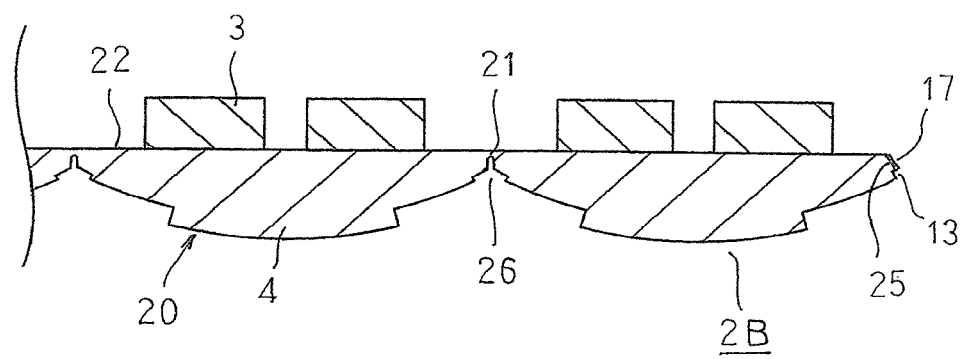
FIG. 15 is a partial cross section that shows a state in which an inner frame is opened out rectilinearly in the electric power converting apparatus according to Embodiment 3 of the present invention.

FIG. 11 is a lateral cross section that shows an electric power converting apparatus according to Embodiment 3 of the present invention, FIG. 12 is a partial cross section that shows a vicinity of an embedded member from FIG. 11, FIG. 13 is a cross section that is taken along A-O-B in FIG. 11 so as to be viewed in the direction of the arrows, FIG. 14 is a partial cross section of a cross section that is taken along A-O-C in FIG. 11 so as to be viewed in the direction of the arrows, and FIG. 15 is a partial cross section that shows a state in which an inner frame is opened out rectilinearly in the electric power converting apparatus according to Embodiment 3 of the present invention.

In FIGS. 11 through 15, an electric power converting apparatus 102 is disposed on a first axial end of a motor unit 200.

The motor unit 200 includes: a cylindrical motor frame 30 that includes: a cylindrical portion 30a; and a bottom portion 30b that closes an opening at a first axial end of the cylindrical portion 30a; an end plate 31 that is disposed at a second axial end of the cylindrical portion 30a; a rotor 33 that is fixed to a main shaft 32 that is rotatably supported by the bottom portion 30b and the end plate 31, and that is rotatably disposed inside the motor frame 30; and a stator 34 that has: a stator core 35; and a stator winding 36 that is mounted to the stator core 35, the stator core 35 being inserted and held by the cylindrical portion 30a, and the stator 34 being disposed so as to surround the rotor 33.

Coolant flow channels 37 are respectively formed at a constant pitch in an axial direction on an outer circumferential surface of the stator core 35 so as to have flow channel directions in a circumferential direction. A communicating groove 38 is formed from a first axial end toward a second end on the outer circumferential surface of the stator core 35 so as to have a groove direction in an axial direction. Thus, the coolant flow channels 37 that are arranged so as to line up in the axial direction are connected with each other by the communicating groove 38.

The motor frame 30 is inserted into the cylindrical outer frame 1A from a second axial end such that the bottom portion 30b is oriented toward a first axial end, is fixed to the outer frame 1A by welding, etc., and is housed and held near a second axial end of the outer frame 1A. The motor unit 200 is installed in the outer frame 1A by fixing the end plate 31 to a second axial end of the motor frame 30 by fastening screws so as to cover the opening of the motor frame 30.

The inner frame 2B is configured into a tubular body that has inner circumferential surfaces that have a hexagonal prism shape internally by bending six base members 20 into an annular shape using thin linking portions 21, inner circumferential edge portions of circumferential side surfaces of the base members 20 being linked together consecutively by the thin linking portions 21, and applying a liquid gasket 17 and butting together end portion butted surfaces 25 of the base members 20 that are positioned at two ends in a direction of linking. Notches 13 are formed so as to extend from a first axial end to a second axial end on radially outer edge portions of the linking portion butted surfaces 24 of the base members 20 that are positioned at the two ends in the direction of linking. An I-shaped sealing member 12a is fitted into the notches 13. Notches 26 are formed so as to extend from the first axial end to the second axial end on outer circumferential sides of the thin linking portions 21 of the linked base members 20 of the inner frame 2B that are configured into a tubular body. Embedded members 27 are fitted into the notches 26 to which the liquid gasket 17 has been applied. In addition, two power modules 3 are mounted to each of the module-mounting surfaces 22 of the respective base members 20 so as to line up circumferentially.

The tubular inner frame 2B to which the power modules 3 have been mounted is inserted into the outer frame 1A from a first axial end, and is housed and held near the first axial end of the outer frame 1A. Here, the inner frame 2B is positioned such that a space that is formed between the protruding portions 4 that are formed on two circumferential sides of the butted portion of the end portion butted surfaces 25 axially faces the communicating grooves 38 that is formed on the stator core 35. A partitioning plate 14 is disposed so as to partition the space that is formed between the protruding portions 4 and the communicating groove 38 into two spaces circumferentially. In addition, a controlling circuit board 6 is housed at a first axial end inside the inner frame 2B, and the front bracket 7 is fixed to a first axial end surface of the outer frame 1A using screws, to assemble the electric power converting apparatus 102.

A front bracket first seal groove 9a is formed on a surface of a front bracket 7 that contacts the outer frame 1A so as to have an annular shape that has a groove direction in a circumferential direction. A front bracket second seal groove 9b is formed at a position on a surface of the front bracket 7 that contacts the inner frame 2B at a position that faces the embedded members 27 so as to have an annular shape that has a groove direction in a circumferential direction. In addition, a rear bracket second seal groove 9b is formed at a position on a surface of the bottom portion 30b that contacts the inner frame 2B at a position that faces the embedded members 27 so as to have an annular shape that has a groove direction in a circumferential direction. In other words, the bottom portion 30b also functions as a rear bracket of the electric power converting apparatus 102. A front-end first sealing member 11a is mounted into the front bracket first seal groove 9a, a front-end second sealing member 12b is mounted into the front bracket second seal groove 9b, and a rear-end second sealing member 12c is mounted into the rear bracket second seal groove 10b.

Here, a frame unit 40B includes the outer frame 1A and the inner frame 2B. In the electric power converting apparatus 102, because twelve power modules 3 are mounted, a positive electrode terminal 61a, a negative electrode terminal 61b, and twelve alternating-current terminals 62 are included in a terminal unit (not shown) that is mounted to the front bracket 7.

Moreover, the rest of the configuration is formed in a similar or identical manner to that of Embodiment 1 above.

In the electric power converting apparatus 102 that is configured in this manner, a liquid cooling jacket is also formed in which a portion of a liquid coolant that is supplied from the inlet nipple 15 to the first space that is partitioned by the partitioning plate 14 circulates through the liquid cooling jacket counterclockwise in a circumferential direction, returns to the second space that is partitioned by the partitioning plate 14, and is discharged through the outlet nipple 16. Liquid coolant leakage from the liquid cooling jacket radially inward through the butted portion of the inner frame 2 at the end portions is prevented by the I-shaped sealing member 12a. Liquid coolant leakage from the liquid cooling jacket radially outward and inward between the frame unit 40B and the front bracket 7 is also prevented by the front-end first sealing member 11a and the front-end second sealing member 12b. In addition, liquid coolant leakage from the liquid cooling jacket radially inward between the frame unit 40B and the bottom portion 30b is prevented by the rear-end second sealing member 12c.

A liquid cooling jacket is also formed in which a remaining portion of the liquid coolant that is supplied from the inlet nipple 15 to the first space that is partitioned by the partitioning plate 14 flows through a first space that is partitioned by the partitioning plate 14 of the communicating groove 38, flows circumferentially through the coolant flow channels 37, returns to the second space that is partitioned by the partitioning plate 14, and is discharged through the outlet nipple 16.

In Embodiment 3, the inner frame 2B is configured by consecutively linking six base members 20 using thin linking portions 21. The liquid cooling jacket is configured between the outer frame 1A and the inner frame 2B simply by disposing a sealing construction at three positions, i.e., the butted portion at the end portion butted surfaces 25, the connecting portion between the front bracket 7 and the first axial end surface of the frame unit 40B, and the connecting portion between the bottom portion 30b and the inner frame 2B. Consequently, similar or identical effects to those of Embodiment 1 above can also be achieved in Embodiment 3.

According to Embodiment 3, because the thin linking portions 21 are formed so as to link together the inner circumferential edge portions of the side surfaces of the base members 20, notches 26 are formed radially outside the thin linking portions 21. Because the inner frame 2A is formed into an approximately cylindrical shape by plastically deforming the thin linking portions 21 of the base members 20, it is possible that gaps may arise at the contacting surfaces between the thin linking portions 21 and the front bracket 7. If gaps arise in the contacting surfaces between the thin linking portions 21 and the front bracket 7, there is a risk that the liquid coolant may leak radially inward through the gaps in question. However, because the embedded members 27 are fitted into the notches 26 to which the liquid gasket 17 has been applied, leakage of the liquid coolant from the liquid cooling jacket radially inward through the notches 26 is prevented. In addition, the liquid gasket 17 is disposed between the end portion butted surfaces 25. Thus, freedom of arrangement of the front-end and rear-end second sealing members 12b and 12c is increased. In other words, the front-end and rear-end second sealing members 12b and 12c may be disposed at radial positions that faces the thin linking portions 21, or may be disposed radially outside the thin linking portions 21.

Because the embedded members 27 are fitted into the notches 26, pressure loss in the liquid coolant is reduced. In addition, if the outer circumferential surfaces of the embedded members 27 are formed such that the inner circumferential surfaces of the liquid coolant flow channels that are formed between the protruding portions 4 of adjacent base members 20 are constituted by portions of an approximately cylindrical surface, pressure loss in the liquid coolant can be further reduced.

The electric power converting apparatus 102 is disposed at the first axial end of the motor unit 200, the liquid cooling jacket of the electric power converting apparatus 102 and the liquid cooling jacket of the motor unit 200 are disposed together in an axial direction, and the two liquid cooling jackets communicate with each other. Thus, body dimensions of the electric power converting apparatus 102 and the motor unit 200 can be reduced.

Moreover, in Embodiment 3 above, the thin linking portions 21 are formed so as to link inner circumferential edge portions of the side surfaces of the base members 20, but the thin linking portions 21 may be formed so as to link radially central portions of the side surfaces of the base members 20.

Figure 16:
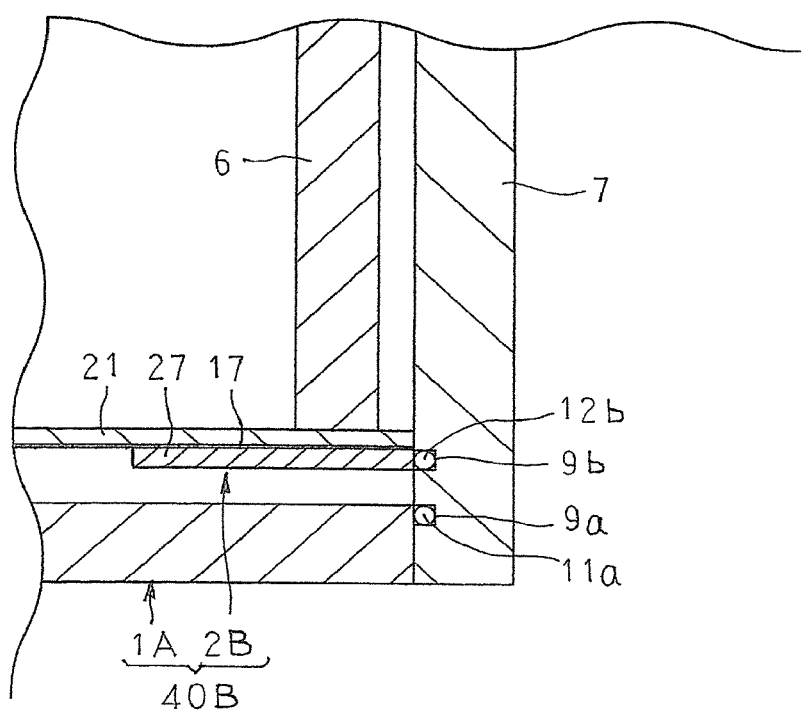
FIG. 16 is a partial cross section that shows a vicinity of a notch in a variation of the electric power converting apparatus according to Embodiment 3 of the present invention.

In Embodiment 3 above, the embedded members 27 are embedded over entire axial lengths of the notches 26, but as shown in FIG. 16, the embedded members 27 may alternatively be embedded only in two axial end portions of the notches 26.

In Embodiment 3 above, the power modules 3 are mounted so as to line up circumferentially on the module-mounting surfaces 22 of the base members 20, but the power modules 3 may be mounted so as to line up axially on the module-mounting surfaces 22 of the base members 20.

In Embodiment 3 above, the motor unit 200 is disposed on an axial end of the electric power converting apparatus 102, but a rotary electric machine such as a generator may be disposed on the axial end of the electric power converting apparatus 102 instead of the motor unit 200.

Embodiment 4

Figure 17:
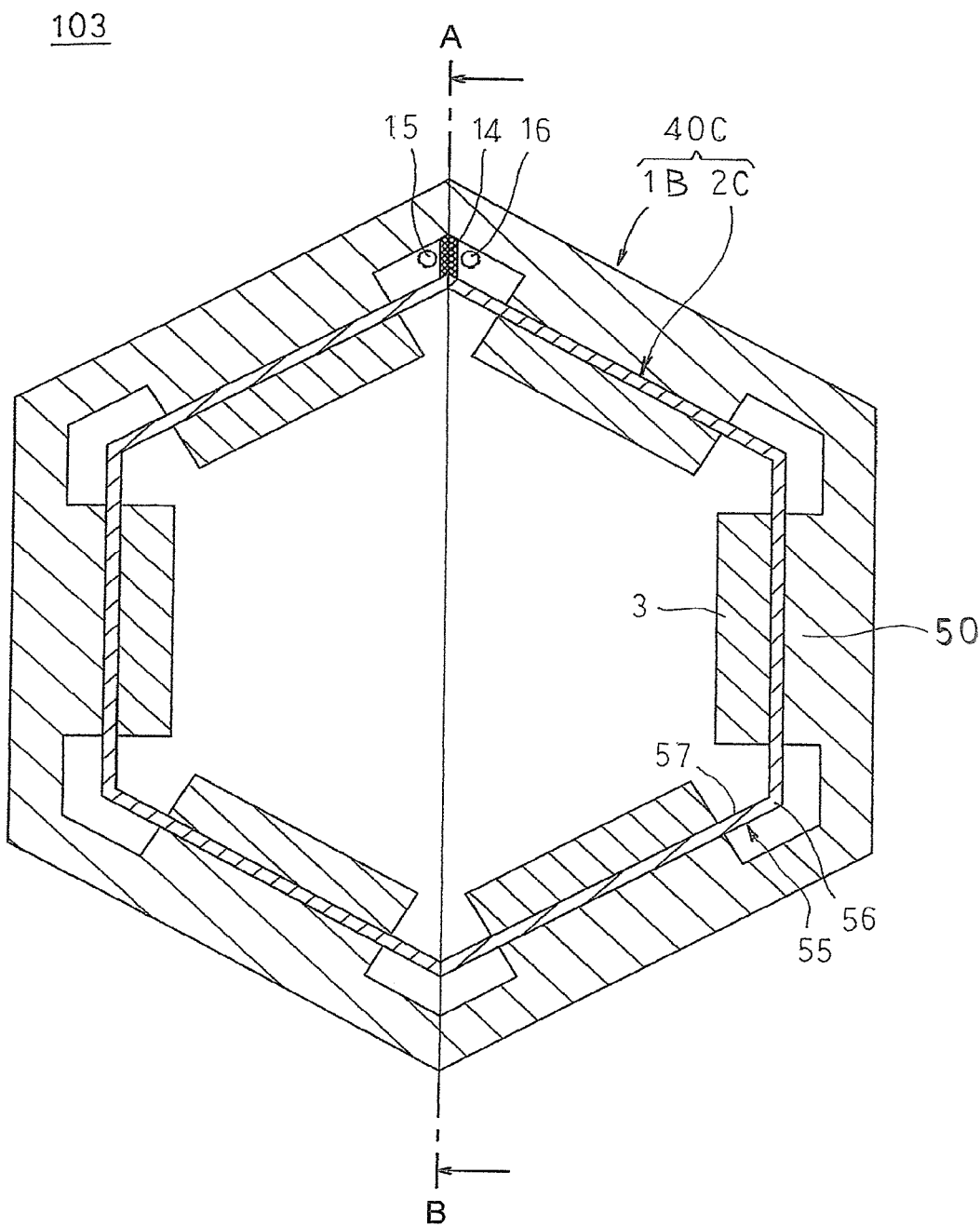
FIG. 17 is a lateral cross section that shows an electric power converting apparatus according to Embodiment 4 of the present invention.
Figure 18:
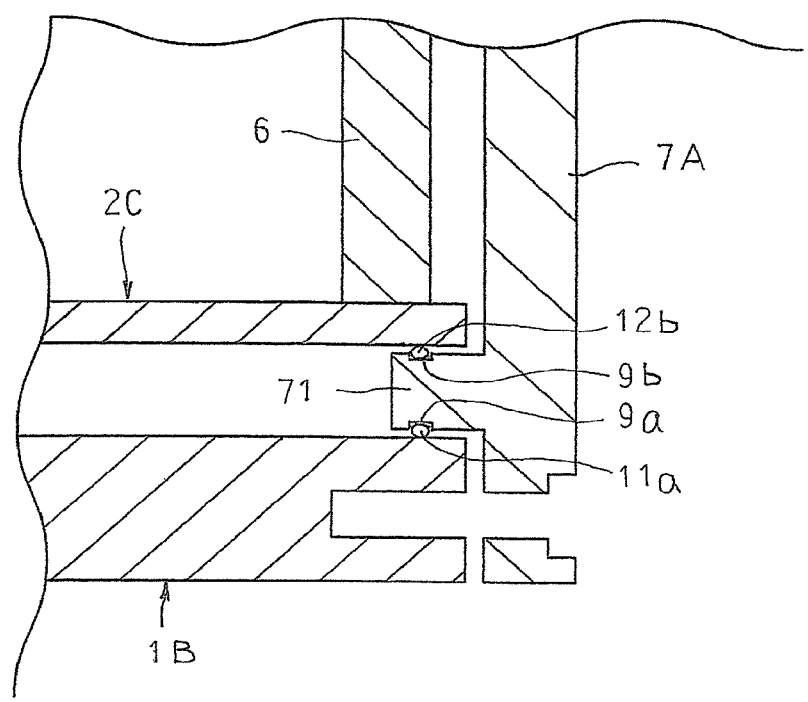
FIG. 18 is a partial cross section of a cross section that is taken along A-B in FIG. 17 so as to be viewed in the direction of the arrows.
Figure 19:
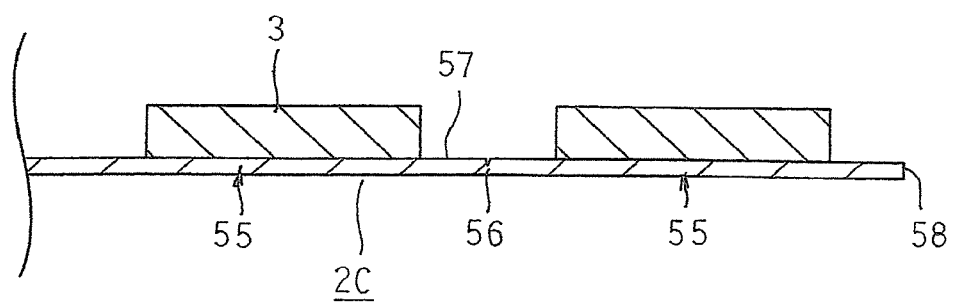
FIG. 19 is a partial cross section that shows a state in which an inner frame is opened out rectilinearly in the electric power converting apparatus according to Embodiment 4 of the present invention.

FIG. 17 is a lateral cross section that shows an electric power converting apparatus according to Embodiment 4 of the present invention, FIG. 18 is a partial cross section of a cross section that is taken along A-B in FIG. 17 so as to be viewed in the direction of the arrows, and FIG. 19 is a partial cross section that shows a state in which an inner frame is opened out rectilinearly in the electric power converting apparatus according to Embodiment 4 of the present invention.

In FIGS. 17 through 19, an outer frame 1B is produced into a hexagonal tubular body that has a hexagonal cross section perpendicular to a central axis, and protruding portions 50 are respectively formed by making regions in circumferentially central portions of side wall surfaces that face radially inward protrude radially inward. In addition, grooves that extend in a circumferential direction are formed on the protruding portions 50 at a constant pitch in an axial direction to constitute radiating fins (not shown).

An inner frame 2C has six flat rectangular base members 55, and is configured into a tubular body that has inner circumferential surfaces that have a hexagonal prism shape externally and that has inner circumferential surfaces that have a hexagonal prism shape internally by bending six base members 55 into an annular shape using bending facilitating portions 56 that function as linking portions, outer circumferential edge portions of circumferential side surfaces of the base members 55 being linked together consecutively by the bending facilitating portions 56, and butting together end portion butted surfaces 58 of the base members 55 that are positioned at two ends in a direction of linking. Outer circumferential portions of the butted portion of the linking portion butted surfaces 25 of the base members 55 are bonded and integrated by welding so as to extend from the first axial end to the second axial end. In addition, one power module 3 is mounted to each of the module-mounting surfaces 57 of the respective base members 55.

Here, the inner frame 2C is configured by forming on one surface of a rectangular flat plate of aluminum, or copper, for example, five notches that are parallel to a short-side direction at a pitch that is equal in a long-side direction. Thus, the base members 55 are formed between the notches, and portions at the notches become thinner to constitute the bending facilitating portions 56. If the thickness of the flat plate of aluminum, or copper, etc., is thin, the inner frame may be configured using a splint to bend the flat plate. In that case, the bent portions constitute linking portions between base members.

The tubular inner frame 2C to which the power modules 3 have been mounted is inserted into the outer frame 1B from a first axial end, and is housed and held inside the outer frame 1B. Here, leading end surfaces of the protruding portions 50 contact outer circumferential surfaces of the base members 55. A partitioning plate 14 is disposed so as to partition the space that is formed between the protruding portions 50 into two spaces circumferentially. In addition, a controlling circuit board 6 is housed at a first axial end inside the inner frame 2C.

A protruding portion 71 is formed on an outer circumferential side of a first surface of a front bracket 7A so as to have a hexagonal ring shape. The protruding portion 71 is formed so as to have an inner circumferential surface shape that is approximately equal to the outer circumferential surface shape of the inner frame 2C, and an outer circumferential surface shape that is approximately equal to the inner circumferential surface shape of the outer frame 1B. In addition, a front bracket first seal groove 9a is formed on a surface of a front bracket 7A that contacts the outer frame 1B, i.e., on the outer circumferential surface of the protruding portion 71, so as to have an annular shape that has a groove direction in a circumferential direction. A front bracket second seal groove 9b is formed at a position on a surface of the front bracket 7A that contacts the inner frame 2C radially inside the thin linking portions 21, i.e., on the inner circumferential surface of the protruding portion 71, so as to have an annular shape that has a groove direction in a circumferential direction. A ring-shaped front-end first sealing member 11a is mounted into the front bracket first seal groove 9a, and a ring-shaped front-end second sealing member 12b is mounted into the front bracket second seal groove 9b.

Moreover, because a rear bracket is also configured in a similar or identical manner to the front bracket 7A, explanation thereof will be omitted here.

The front bracket 7A is fixed to the first axial end surface of the outer frame 1B by fastening screws from the first axial end such that the protruding portion 71 is inserted into the gap between the outer frame 1B and the inner frame 2C. The rear bracket (not shown) is similarly fixed to the second axial end surface of the outer frame 1B by fastening screws from the second axial end such that a protruding portion is inserted into the gap between the outer frame 1B and the inner frame 2C, to assemble the electric power converting apparatus 103.

Here, a frame unit 40C includes the outer frame 1B and the inner frame 2C. In the electric power converting apparatus 103, because six power modules 3 are mounted, a positive electrode terminal 61a, a negative electrode terminal 61b, and six alternating-current terminals 62 are included in a terminal unit (not shown) that is mounted to the front bracket 7A.

Moreover, the rest of the configuration is formed in a similar or identical manner to that of Embodiment 1 above.

In the electric power converting apparatus 103 that is configured in this manner, a liquid cooling jacket is also formed in which a liquid coolant that is supplied from the inlet nipple 15 to the first space that is partitioned by the partitioning plate 14 circulates through the liquid cooling jacket counterclockwise in a circumferential direction in FIG. 17, returns to the second space that is partitioned by the partitioning plate 14, and is discharged through the outlet nipple 16. Because the welded portion that joins the butted portion of the end portion butted surfaces of the inner frame 2C functions as a sealing member, liquid coolant leakage from the liquid cooling jacket radially inward through the butted portion of the inner frame 2C at the end portions is prevented. Liquid coolant leakage from the liquid cooling jacket radially outward and inward between the frame unit 40C and the front bracket 7A is also prevented by the front-end first sealing member 11a and the front-end second sealing member 12b. In addition, liquid coolant leakage from the liquid cooling jacket radially inward between the frame unit 40C and the rear bracket is prevented by the rear-end first sealing member and the rear-end second sealing member.

In Embodiment 4, the inner frame 2C is configured by consecutively linking six base members 55 using bending facilitating portions 56. The liquid cooling jacket is configured between the outer frame 1B and the inner frame 2C simply by disposing a sealing construction at three positions, i.e., the butted portion at the end portion butted surfaces 58, the connecting portion between the front bracket 7A and the first axial end surface of the frame unit 40C, and the connecting portion between the rear bracket and the frame unit 40C. Consequently, similar or identical effects to those of Embodiment 1 above can also be achieved in Embodiment 4.

Embodiment 5

Figure 20:
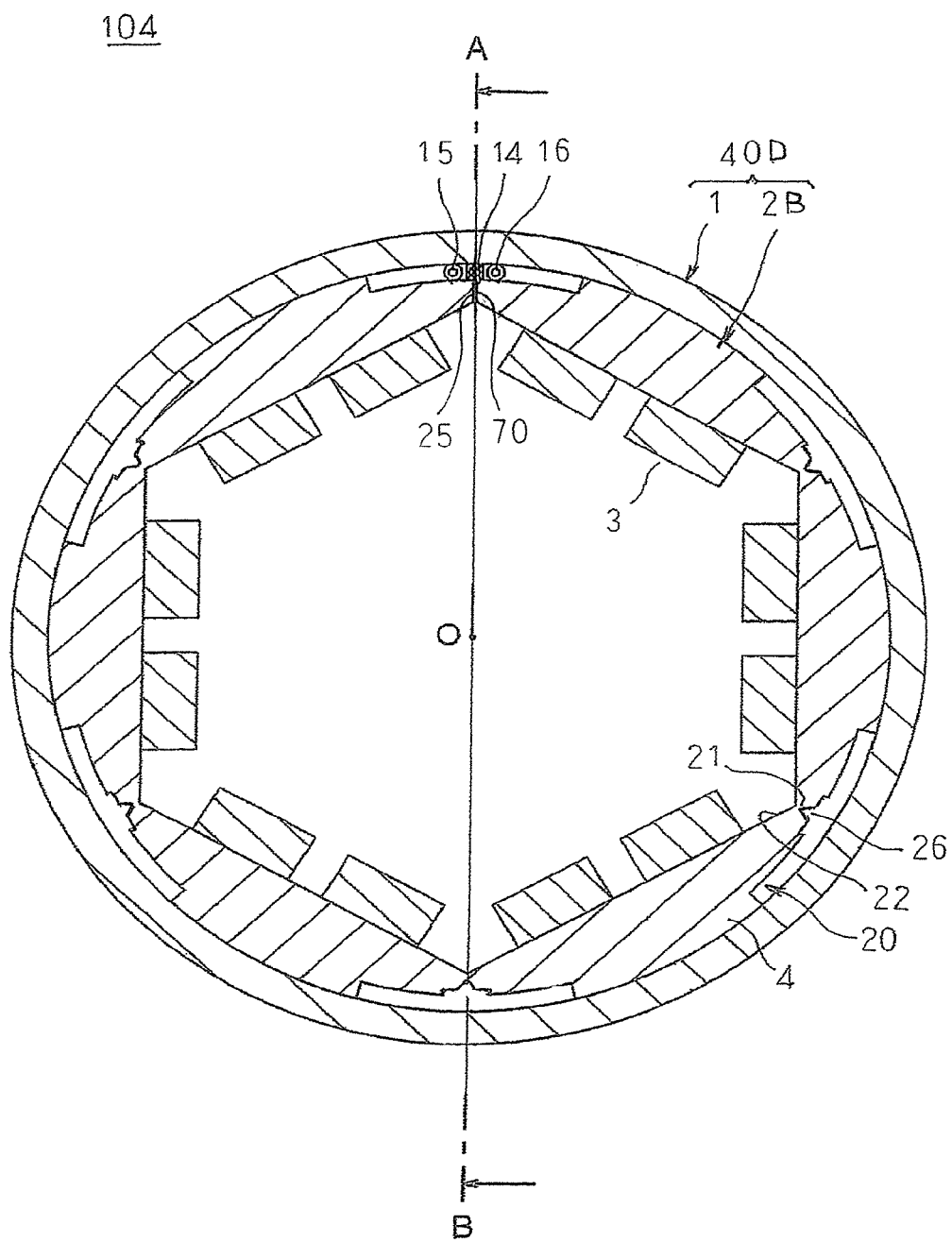
FIG. 20 is a lateral cross section that shows an electric power converting apparatus according to Embodiment 5 of the present invention.
Figure 21:
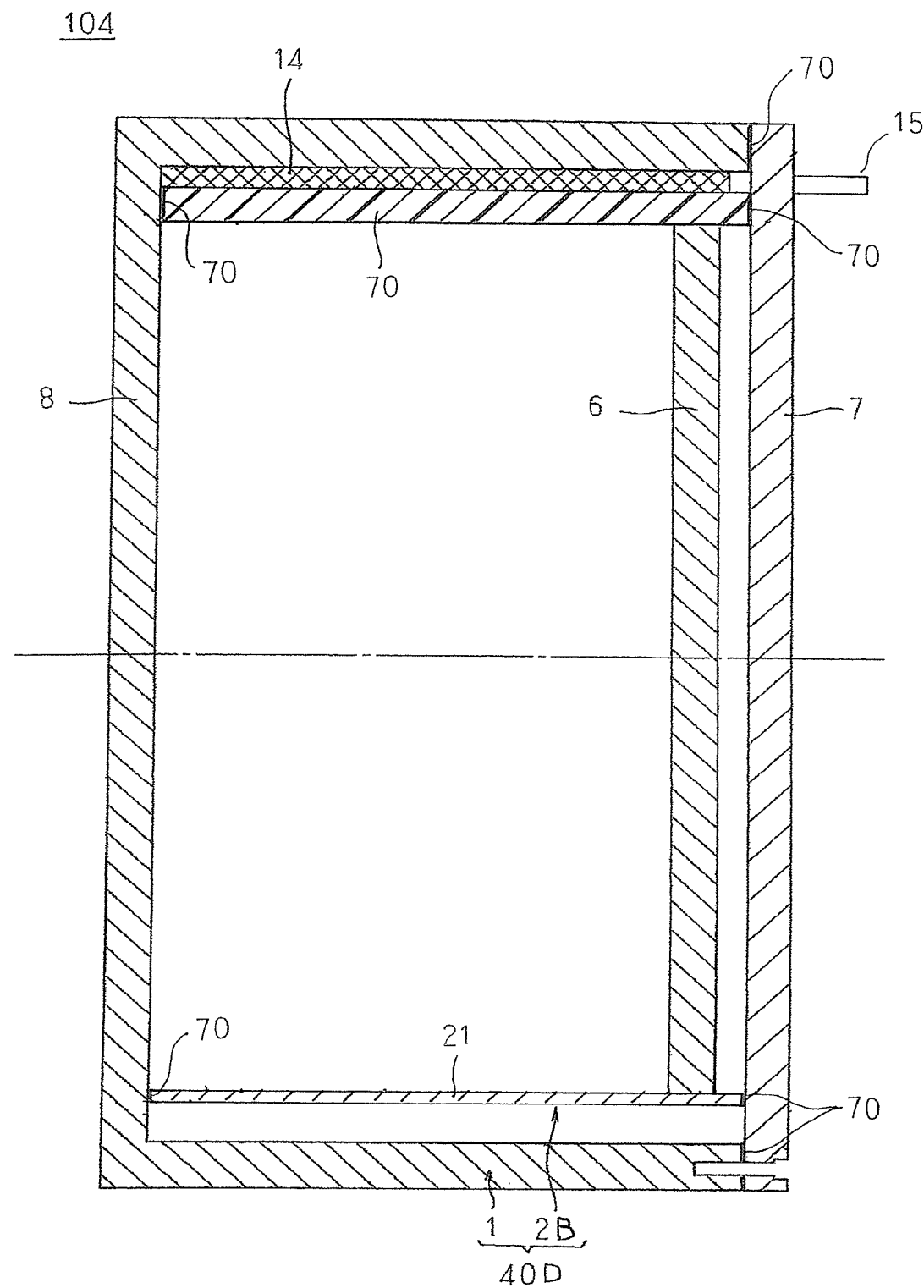
FIG. 21 is a cross section that is taken along A-O-B in FIG. 20 so as to be viewed in the direction of the arrows.

FIG. 20 is a lateral cross section that shows an electric power converting apparatus according to Embodiment 5 of the present invention, and FIG. 21 is a cross section that is taken along A-O-B in FIG. 20 so as to be viewed in the direction of the arrows.

In FIGS. 20 and 21, an inner frame 2B is configured into a tubular body that has inner circumferential surfaces that have a hexagonal prism shape internally by bending six base members 20 into an annular shape using thin linking portions 21, inner circumferential edge portions of circumferential side surfaces of the base members 20 being linked together consecutively by the thin linking portions 21, and applying a liquid gasket 70 and butting together end portion butted surfaces 25 of the base members 20 that are positioned at two ends in a direction of linking. Notches 26 are formed so as to extend from the first axial end to the second axial end on outer circumferential sides of the thin linking portions 21 of the linked base members 20 of the inner frame 2B that are configured into a tubular body. In addition, two power modules 3 are mounted to each of the module-mounting surfaces 22 of the respective base members 20 so as to line up circumferentially.

The tubular inner frame 2B to which the power modules 3 have been mounted is inserted into the outer frame 1 from a first axial end, and is housed and held near the first axial end of the outer frame 1. A partitioning plate 14 is disposed so as to partition a space that is formed between protruding portions 4 that are positioned on two circumferential sides of end portion butted surfaces 25 into two spaces circumferentially. In addition, a controlling circuit board 6 is housed at a first axial end inside the inner frame 2B, and the front bracket 7 is fixed to a first axial end surface of the outer frame 1 using screws, to assemble the electric power converting apparatus 104.

Here, a frame unit 40D includes the outer frame 1 and the inner frame 2B. The outer frame 1 and a rear bracket 8 are formed integrally, and are configured so as to have a floored cylindrical shape. A liquid gasket 70 that functions as a sealing member is applied to contacting surfaces between the outer frame 1 and the front bracket 7, to contacting surfaces between the inner frame 2B and the front bracket 7, to contacting surfaces between the inner frame 2B and the rear bracket 8, and to end portion butted surfaces 25 of the base members 20 that are positioned at two ends of the inner frame 2B.

Moreover, the rest of the configuration is formed in a similar or identical manner to that of Embodiment 1 above.

In the electric power converting apparatus 104 that is configured in this manner, a liquid cooling jacket is also formed in which a liquid coolant that is supplied from the inlet nipple 15 to the first space that is partitioned by the partitioning plate 14 circulates through the liquid cooling jacket counterclockwise in a circumferential direction, returns to the second space that is partitioned by the partitioning plate 14, and is discharged through the outlet nipple 16. Liquid coolant leakage from the liquid cooling jacket radially inward between the end portion butted surfaces 25 of the inner frame 2B, liquid coolant leakage from the liquid cooling jacket radially outward and inward between the frame unit 40B and the front bracket 7, and also liquid coolant leakage from the liquid cooling jacket radially inward between the front bracket 7 and the rear bracket 6 is prevented by the liquid gasket 70.

Consequently, similar or identical effects to those of Embodiment 1 above can also be achieved in Embodiment 5. According to Embodiment 5, because liquid coolant leakage is prevented by applying the liquid gasket 70, separate members for sealing are no longer required, enabling simplification of the construction to be achieved.

Moreover, in each of the above embodiments, front bracket first and second seal grooves and rear bracket first and second seal grooves are formed on a front bracket and a rear bracket, but these seal grooves may be formed on an outer frame and an inner frame.

The invention claimed is:

1. An electric power converting apparatus comprising:
a frame unit that is configured by a tubular outer frame and a tubular inner frame that is held in said outer frame in a fitted state;
a bracket that is disposed on two axial ends or on one axial end of said frame unit;
power modules that are housed inside said frame unit, and that convert direct-current power to alternating-current power; and
a controlling apparatus that is housed inside said frame unit, and that controls driving of said power modules, wherein:
a liquid cooling jacket is configured between said inner frame and said outer frame so as to have an annular shape;
said inner frame comprises a plurality of base members and linking portions that consecutively link said base members;
said base members is configured into a tubular shape in a state that base members that are positioned at two ends in a direction of linking are butted together at a butted portion;
said power modules are mounted to side wall surfaces of said inner frame that face radially inward; and
sealing members that seal said liquid cooling jacket are respectively disposed in said butted portion of said base members that are positioned at said two ends in said direction of linking, and between said frame unit and said bracket.

2. The electric power converting apparatus according to claim 1, wherein said linking portions are thin linking portions in which a radial thickness is thinner than a radial thickness of said base members.

3. The electric power converting apparatus according to claim 2, wherein:
said thin linking portions link together portions of said base members that are radially further outward than a radially inner edge portion; and
an auxiliary sealing material is disposed radially inside said thin linking portions between said linked base members.

4. The electric power converting apparatus according to claim 2, wherein:
said thin linking portions link together radially inner edge portions or radially central portions of said base members;
a notch is formed radially outside said thin linking portions of said linked base members;
an embedded member is fitted into said notch; and
an auxiliary sealing material is disposed between said embedded member and said notch.

5. The electric power converting apparatus according to claim 1, wherein a radially sealed region in said butted portion of said base members that are positioned at said two ends in said direction of linking and a radially sealed region between said inner frame and said bracket overlap.

6. The electric power converting apparatus according to claim 5, wherein said sealing member that is disposed on said butted portion of said base members that are positioned at said two ends in said direction of linking and said sealing member that is disposed between said inner frame and said bracket are configured so as to be integrated.

7. The electric power converting apparatus according to claim 1, wherein said liquid cooling jacket comprises a plurality of radiating fins that are divided in a circumferential direction, said radiating fins being greater in number than or equal in number to said base members.

8. The electric power converting apparatus according to claim 7, wherein said plurality of radiating fins are each disposed radially outside a region of contact between said power modules and said inner frame, and are formed so as to have a circumferential width that has a length that is greater than or equal to a circumferential width of said region of contact between said power modules and said inner frame that correspond to each other.

9. The electric power converting apparatus according to claim 1, further comprising a rotary electric machine at a second axial end of said frame unit.

* * * * *